United States Patent
Chang et al.

(10) Patent No.: US 10,224,079 B2
(45) Date of Patent: Mar. 5, 2019

(54) CHARGE PUMP CIRCUIT WITH LOW REVERSE CURRENT AND LOW PEAK CURRENT

(71) Applicant: eMemory Technology Inc., Hsin-Chu (TW)

(72) Inventors: Wu-Chang Chang, Hsinchu County (TW); Cheng-Te Yang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/604,662

(22) Filed: May 25, 2017

(65) Prior Publication Data

US 2017/0346393 A1   Nov. 30, 2017

Related U.S. Application Data

(60) Provisional application No. 62/341,105, filed on May 25, 2016.

(51) Int. Cl.
  *G11C 7/06* (2006.01)
  *G11C 5/14* (2006.01)
  (Continued)

(52) U.S. Cl.
  CPC .............. *G11C 7/065* (2013.01); *G11C 5/145* (2013.01); *G11C 5/147* (2013.01); *G11C 7/062* (2013.01);
  (Continued)

(58) Field of Classification Search
  CPC ............. H02M 3/07; H02M 2003/071; H02M 2003/072; H02M 2003/075; H02M 2003/076; H02M 2003/077; H02M 2003/078; H02M 3/073; H03K 5/134; G11C 5/145; G11C 5/147; G11C 7/062
  (Continued)

(56) References Cited

U.S. PATENT DOCUMENTS 5,687,128 A * 11/1997 Lee .................... G11O 5/145
                                                      365/226
5,874,850 A    2/1999 Pulvirenti
(Continued)

FOREIGN PATENT DOCUMENTS

CN        101056104 A       10/2007
TW        200840211         10/2008
(Continued)

*Primary Examiner* — Patrick C Chen
(74) *Attorney, Agent, or Firm* — Winston Hsu

(57) ABSTRACT

A charge pump circuit includes a voltage input port, a voltage output port, a plurality of charge pump units cascaded between the voltage input port and the voltage output port, a clock signal source, and N clock delay elements. The clock signal source generates a main clock signal and the N clock delay elements generate clock signals received by the charge pump units by delaying the main clock signal. The main clock signal received by the first charge pump unit has a rising edge leading a rising edge of the last clock signal received by the last charge pump unit, and a falling edge lagging the rising edge of the last clock signal. Each of the charge pump units includes two sets of inverters with delay elements for generating two complementary clock signals.

9 Claims, 7 Drawing Sheets

(51) Int. Cl.

| | | |
|---|---|---|
| *G11C 7/12* | (2006.01) | |
| *G11C 7/22* | (2006.01) | |
| *H03K 5/134* | (2014.01) | |
| *H02M 3/07* | (2006.01) | |
| *H03K 3/012* | (2006.01) | |
| *H03K 17/687* | (2006.01) | |
| *G11C 17/16* | (2006.01) | |
| *G11C 17/18* | (2006.01) | |
| *H01L 23/525* | (2006.01) | |
| *H01L 27/112* | (2006.01) | |
| *H01L 29/06* | (2006.01) | |
| *H01L 29/08* | (2006.01) | |
| *H01L 29/10* | (2006.01) | |
| *H01L 29/16* | (2006.01) | |
| *H01L 29/165* | (2006.01) | |
| *H01L 29/423* | (2006.01) | |
| *H01L 29/78* | (2006.01) | |
| *G11C 7/18* | (2006.01) | |
| *G11C 7/14* | (2006.01) | |
| *G11C 16/28* | (2006.01) | |
| *G11C 29/00* | (2006.01) | |
| *H03K 5/00* | (2006.01) | |
| *H03K 5/159* | (2006.01) | |
| *G11C 11/419* | (2006.01) | |
| *G11C 13/00* | (2006.01) | |

(52) U.S. Cl.
CPC ............... *G11C 7/12* (2013.01); *G11C 7/14* (2013.01); *G11C 7/18* (2013.01); *G11C 7/22* (2013.01); *G11C 16/28* (2013.01); *G11C 17/165* (2013.01); *G11C 17/18* (2013.01); *G11C 29/78* (2013.01); *H01L 23/5252* (2013.01); *H01L 27/11206* (2013.01); *H01L 29/0649* (2013.01); *H01L 29/0847* (2013.01); *H01L 29/1095* (2013.01); *H01L 29/165* (2013.01); *H01L 29/1608* (2013.01); *H01L 29/42376* (2013.01); *H01L 29/7848* (2013.01); *H01L 29/7851* (2013.01); *H02M 3/07* (2013.01); *H03K 3/012* (2013.01); *H03K 5/134* (2014.07); *H03K 17/687* (2013.01); *G11C 7/06* (2013.01); *G11C 11/419* (2013.01); *G11C 2013/0042* (2013.01); *G11C 2207/002* (2013.01); *G11C 2207/005* (2013.01); *G11C 2211/4013* (2013.01); *H02M 2003/075* (2013.01); *H03K 5/159* (2013.01); *H03K 2005/00195* (2013.01)

(58) Field of Classification Search
USPC .......................................................... 327/288
See application file for complete search history.

(56) References Cited

U.S. PATENT DOCUMENTS

| | | | |
|---|---|---|---|
| 6,483,377 B2 | 11/2002 | White | |
| 6,734,717 B2 * | 5/2004 | Min | ............ H02M 3/073 327/536 |
| 7,439,795 B2 * | 10/2008 | Yanagigawa | ......... H02M 3/073 327/536 |
| 2007/0241798 A1 | 10/2007 | Masenas | |

FOREIGN PATENT DOCUMENTS

| TW | 201023488 A1 | 6/2010 |
|---|---|---|
| TW | I574498 B | 3/2017 |

* cited by examiner

CHARGE PUMP CIRCUIT WITH LOW REVERSE CURRENT AND LOW PEAK CURRENT

CROSS REFERENCE TO RELATED APPLICATIONS

This non-provisional application claims priority of U.S. provisional application No. 62/341,105, filed on May 25, 2016, included herein by reference in its entirety.

BACKGROUND OF THE INVENTION

1. Field of the Invention

This invention is related to a charge pump circuit, especially to a charge pump with low reverse current and low peak current.

2. Description of the Prior Art

Due to requirements of low power for electronic devices, the power specification of integrated circuits (IC) is redesigned to work in a low voltage environment for reducing power consumption. For example, the IC power specification that used to be 5V before is now reduced to 3.3V or even lower than 2V. Although lower voltages are supplied to reduce power consumption, greater voltages are still needed in some situations. For example, flash memory may require a greater voltage for programming or erasing. The greater voltage is usually supplied by a charge pump circuit.

The charge pump circuits of prior art are usually controlled by complementary clock signals. The complementary clock signals are usually generated by passing the main clock signals to two different signal paths with different number of inverters. However, since the two generated clock signals are generated through different paths, the phase difference between the two generated clock signals are usually not 180. Instead, one of the clock signals may lead the other clock signal. The imperfect complementary clock signals will cause an unwanted reverse current of the charge pump circuit, increasing power consumption. Furthermore, to supply even higher voltages, the charge pump circuit has several stages. In this case, a high peak current will occur if the clock signals are not controlled properly. Therefore, the control of the clock signals becomes complicated.

SUMMARY OF THE INVENTION

One embodiment of the present disclosure discloses a charge pump unit. The charge pump unit includes an input terminal, an output terminal, a first N-type transistor, a second N-type transistor, a first P-type transistor, a second P-type transistor, a first capacitor, a second capacitor, a clock input terminal, P first inverters, Q second inverters, and R delay elements.

The first N-type transistor has a first terminal coupled to the input terminal, a second terminal, and a control terminal. The second N-type transistor has a first terminal coupled to the input terminal, a second terminal coupled to the control terminal of the first N-type transistor, and a control terminal coupled to the second terminal of the first N-type transistor. The first P-type transistor has a first terminal coupled to the second terminal of the first N-type transistor, a second terminal coupled to the output terminal, and a control terminal. The second P-type transistor has a first terminal coupled to the second terminal of the second N-type transistor and the control terminal of the first P-type transistor, a second terminal coupled to the output terminal, and a control terminal coupled to the first terminal of the first P-type transistor.

The first capacitor has a first terminal coupled to the second terminal of the first N-type transistor, and a second terminal. The second capacitor has a first terminal coupled to the second terminal of the second N-type transistor, and a second terminal. The clock input terminal receives a clock signal.

P first inverters are coupled in series between the clock input terminal and the second terminal of the first capacitor. R delay elements are coupled in series with the Q second inverters between the clock input terminal and the second terminal of the second capacitor. P and R are positive integers, and Q is an integer smaller than P. The difference between P and Q is an odd number.

Another embodiment of the present disclosure discloses a charge pump circuit. The charge pump circuit includes a voltage input port, a voltage output port, a plurality of charge pump unit, a clock signal source, and N clock delay elements.

The voltage input port receives an input voltage, and the voltage output port outputs a pumped voltage. The plurality of charge pump units are cascaded between the voltage input port and the voltage output port.

The clock signal source generates a main clock signal. The N clock delay elements are coupled to the clock signal source and generate clock signals received by the plurality of charge pump units by delaying the main clock signal. N is a positive integer.

The first charge pump unit of the plurality of charge pump receives the main clock signal. The main clock signal has a rising edge leading a rising edge of a second clock signal received by the last charge pump unit of the plurality of charge pump units coupled to the output port, and a falling edge lagging the rising edge of the second clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
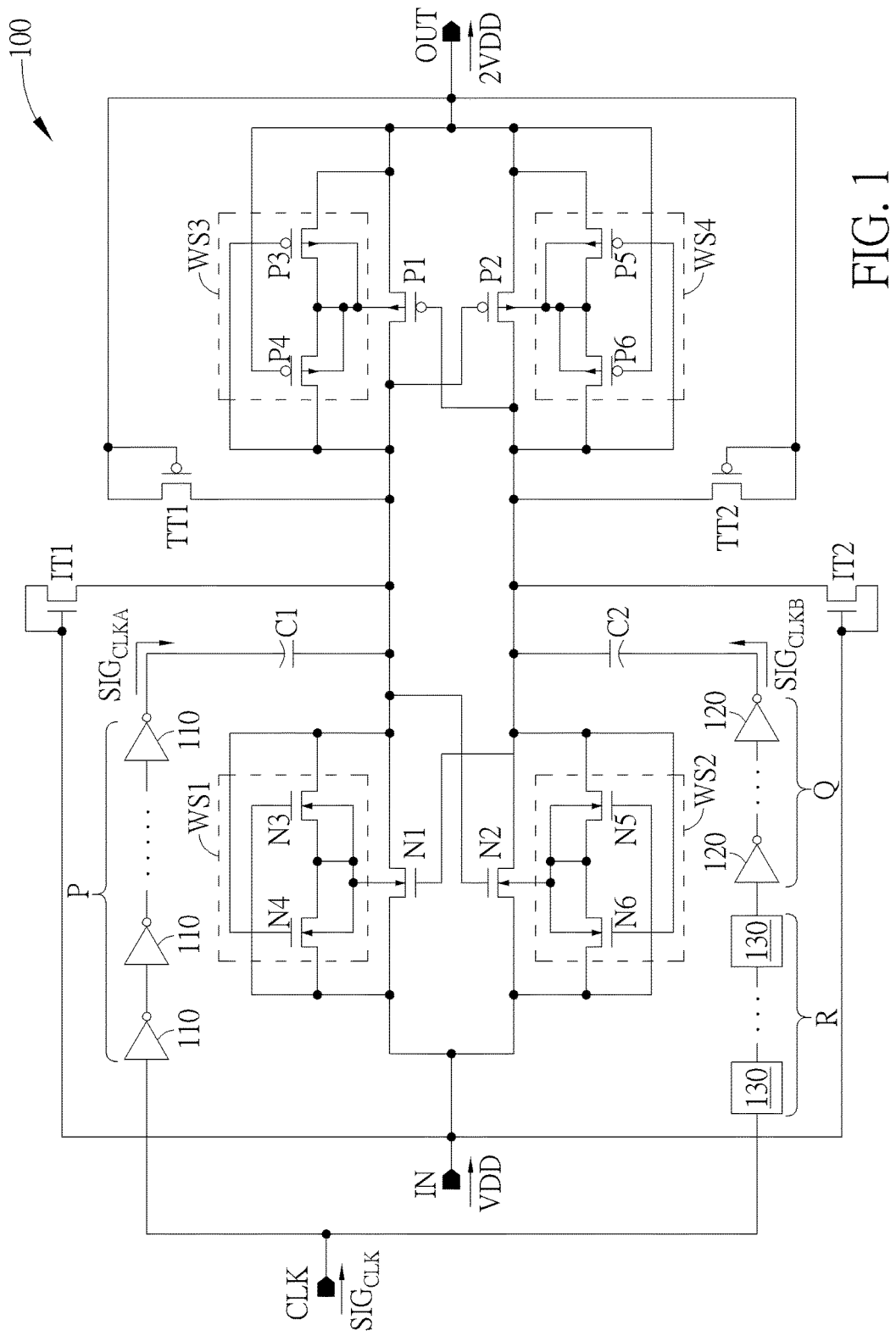
FIG. 1 shows a charge pump unit according to one embodiment of the present disclosure.

FIG. 1 shows a charge pump unit 100 according to one embodiment of the present disclosure. The charge pump unit 100 includes an input terminal IN, an output terminal OUT, a first N-type transistor N1, a second N-type transistor N2, a first P-type transistor P1, a second P-type transistor P2, a first capacitor C1, a second capacitor C2, a clock input terminal CLK, P first inverters 110, Q second inverters 120, and R delay elements 130. P is a positive integer, Q is a non-negative integer smaller than P, and R is a positive integer.

The first N-type transistor N1 has a first terminal, a second terminal, a control terminal, and a body terminal. The first terminal of the first N-type transistor N1 is coupled to the input terminal IN. The second N-type transistor N2 has a first terminal, a second terminal, a control terminal, and a body terminal. The first terminal of the second N-type transistor N2 is coupled to the input terminal IN, the second terminal of the second N-type transistor N2 is coupled to the control terminal of the first N-type transistor N1, and the control terminal of the second N-type transistor N2 is coupled to the second terminal of the first N-type transistor N1.

The first P-type transistor P1 has a first terminal, a second terminal, a control terminal, and a body terminal. The first terminal of the first P-type transistor P1 is coupled to the second terminal of the first N-type transistor N1, the second terminal of the first P-type transistor P1 is coupled to the output terminal OUT. The second P-type transistor P2 has a first terminal, a second terminal, a control terminal, and a body terminal. The first terminal of the second P-type transistor P2 is coupled to the second terminal of the second N-type transistor N2 and the control terminal of the first P-type transistor P1, the second terminal of the second P-type transistor P2 is coupled to the output terminal OUT, and the control terminal of the second P-type transistor P2 is coupled to the first terminal of the first P-type transistor P1.

The first capacitor C1 has a first terminal and a second terminal. The first terminal of the first capacitor C1 is coupled to the second terminal of the first N-type transistor N1. The second capacitor C2 has a first terminal and a second terminal. The first terminal of the second capacitor C2 is coupled to the second terminal of the second N-type transistor N2.

The clock input terminal CLK receives a clock signal $SIG_{CLK}$. The P first inverters 110 are coupled in series between the clock input terminal CLK and the second terminal of the first capacitor C1. The Q second inverters 120 and the R delay elements 130 are coupled in series between the clock input terminal CLK and the second terminal of the second capacitor C2.

Also, a difference between P and Q is an odd number so that the clock signal $SIG_{CLKA}$ received by the first capacitor C1 and the clock signal $SIG_{CLKB}$ received by the second capacitor C2 would be complementary to each other. For example, P can be 3 and Q can be 2. To ensure the phase difference between the clock signal $SIG_{CLKA}$ and the clock signal $SIG_{CLKB}$ remains 180 degrees, the R delay elements 130 are coupled in series with the Q second inverters 120 between the clock input terminal CLK and the second terminal of the second capacitor C2. The R delay elements 130 can be designed to provide a proper delay so that the delay caused by the P first inverters 110 would be substantially equal to the delay caused by the Q second inverters 120 and the R delay elements 130. Therefore, clock signal $SIG_{CLKA}$ and the clock signal $SIG_{CLKB}$ can toggle at the same time, reducing the reverse current of the charge pump unit 100.

Figure 2:
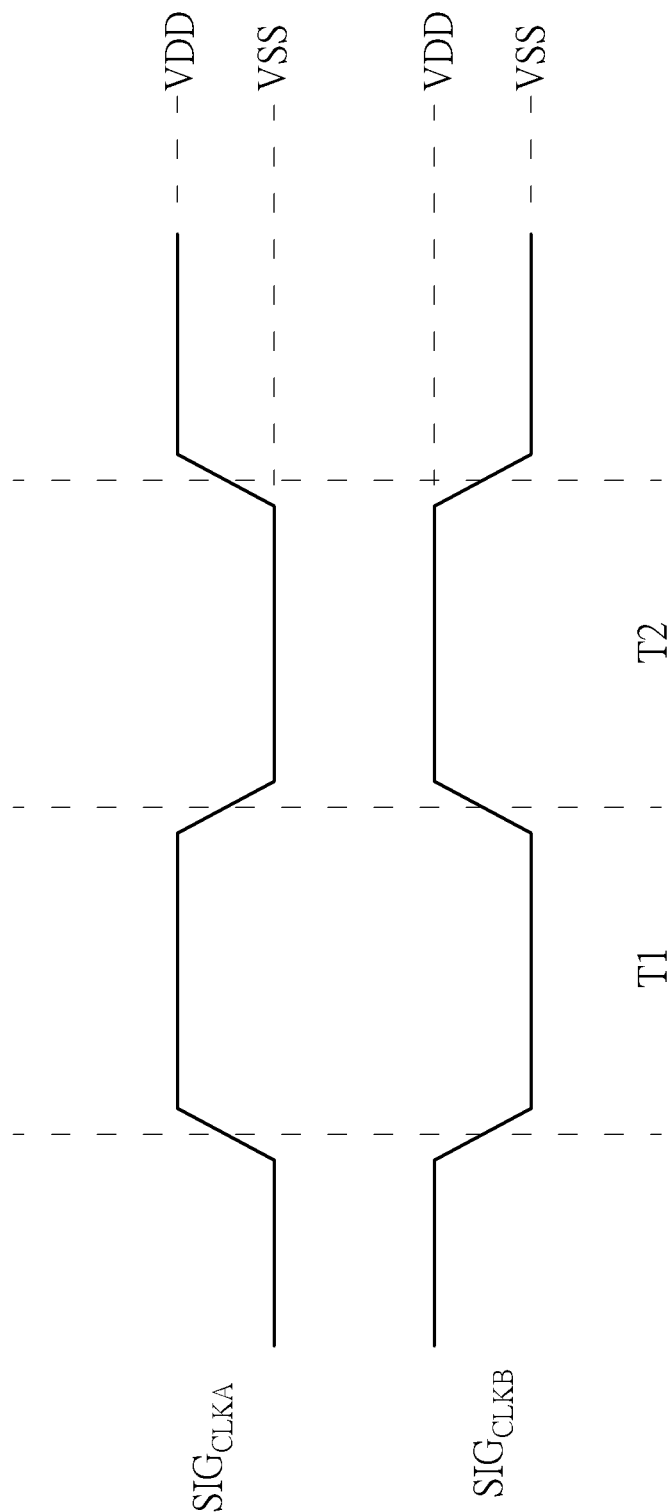
FIG. 2 shows the waveforms of the clock signals used in the charge pump unit of FIG. 1.

FIG. 2 shows the waveforms of the clock signal $SIG_{CLKA}$ and the clock signal $SIG_{CLKB}$. In FIG. 2, during the period T1, the clock signal $SIG_{CLKA}$ is at a first voltage VDD and the clock signal $SIG_{CLKB}$ is at a second voltage VSS lower than the first voltage VDD. In some embodiments, the input terminal IN of the charge pump unit 100 may also receive the first voltage VDD.

In the previous period before period T1, the first terminal of the first capacitor C1 may have been charged to the first voltage VDD through the first N-type transistor N1 while the second terminal of the first capacitor C1 is at the second voltage VSS. In period T1, since the clock signal $SIG_{CLKA}$ is raised to the first voltage VDD, the first terminal of the first capacitor C1 is raised to a third voltage 2VDD, which is two times the first voltage VDD. Therefore, the second N-type transistor N2 is turned on, so the first terminal of the second capacitor C2 would be charged to the first voltage VDD through the second N-type transistor N2 while the second terminal of the second capacitor C2 would follow the clock signal $SIG_{CLKB}$ to be at the second voltage VSS.

In addition, the first P-type transistor P1 is turned on and the second P-type transistor P2 is turned off. Therefore, the third voltage 2VDD would be outputted to the output terminal OUT through the first P-type transistor P1.

Similarly, in period T2, the clock signal $SIG_{CLKA}$ is at the second voltage VSS and the clock signal $SIG_{CLK2}$ is at the first voltage VDD. Since the first terminal of the second capacitor C2 has been charged to the first voltage VDD through the second N-type transistor N2 in period T1, the first terminal of the second capacitor C2 would be raised to the third voltage 2VDD in period T2. Therefore, the first N-type transistor N1 is turned on, so the first terminal of the first capacitor C1 would be charged to the first voltage VDD while the second terminal of the first capacitor C1 would follow the clock signal $SIG_{CLKA}$ to be at the second voltage VSS.

In addition, the second P-type transistor P2 is turned on and the first P-type transistor P1 is turned off. Therefore, the third voltage 2VDD would be outputted to the output terminal OUT through the second P-type transistor P2.

Consequently, the first P-type transistor P1 and the second P-type transistor P2 can alternatively output the third voltage 2VDD, which is two times the input voltage VDD. In prior art, if the clock signal $SIG_{CLKA}$ and the clock signal $SIG_{CLKB}$ do not toggle at the same time, then the reverse current may occur. For example, if the clock signal $SIG_{CLKB}$ changes from the first voltage VDD to the second voltage VSS before the clock signal $SIG_{CLKA}$ changes from the second voltage VSS to the first voltage VDD, then the clock signal $SIG_{CLKA}$ and clock signal $SIG_{CLKB}$ would be both at the second voltage VSS in a short period. In this short period, both the first P-type transistor P1 and the second P-type transistor P2 may be turned on, causing the reverse current to flow from the output terminal OUT back to the first terminal of the first P-type transistor P1 and the first terminal of the second P-type transistor P2 through the first P-type transistor P1 and the second P-type transistor P2.

However, since the delay caused by the P first inverters 110 would be substantially equal to the delay caused by the Q second inverters 120 and the R delay elements 130, the charge pump unit 100 can reduce the reverse current caused by the mismatched clock signals.

Figure 3:
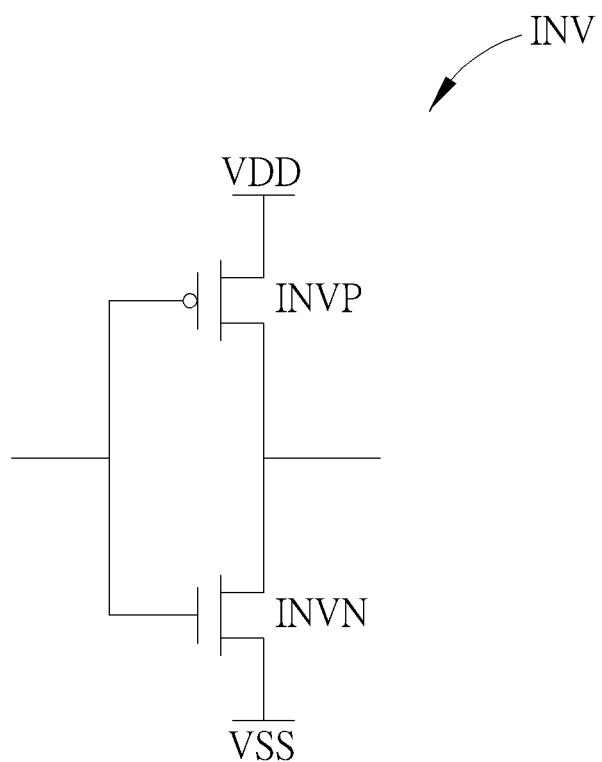
FIG. 3 shows an inverter according to one embodiment of the present disclosure.

FIG. 3 shows an inverter INV according to one embodiment of the present disclosure. The P first inverters 110 and the Q second inverters 120 each can have the same structure as the inverter INV. The inverter INV includes an input terminal, an output terminal, a P-type transistor INVP and an N-type transistor INVN. The P-type transistor INVP has a first terminal, a second terminal, and a control terminal. The first terminal of the P-type transistor INVP receives a first bias voltage, for example, the first voltage VDD, the second terminal of the P-type transistor INVP is coupled to the output terminal of the inverter INV, and the control terminal of the P-type transistor INVP is coupled to the input terminal of the inverter INV. The N-type transistor INVN has a first terminal, a second terminal, and a control terminal. The first terminal of the N-type transistor INVN is coupled to the output terminal of the inverter INV, the second terminal of the N-type transistor INVN receives the second bias voltage, for example, the second voltage VSS, and the control terminal of the N-type transistor INVN is coupled to the input terminal of the inverter INV.

Figure 4:
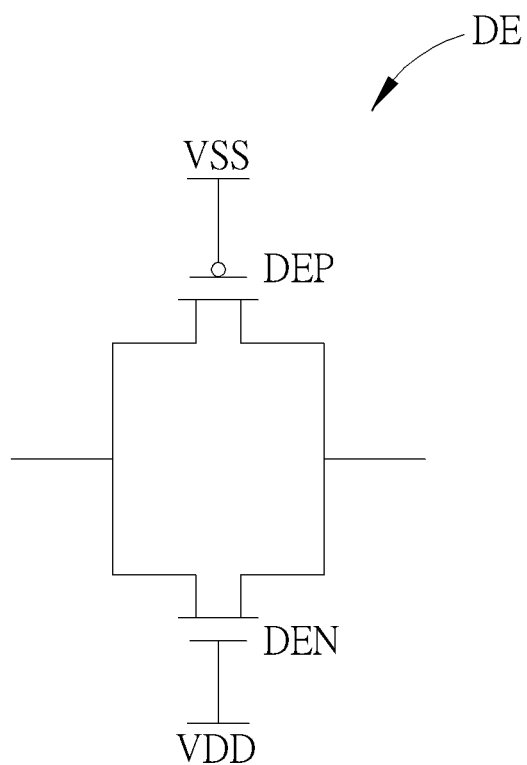
FIG. 4 shows a delay element according to one embodiment of the present disclosure.

FIG. 4 shows a delay element DE according to one embodiment of the present disclosure. Each of the R delay elements 130 may have the same structure as the delay element DE. The delay element DE includes an input terminal, an output terminal, an N-type transistor DEN, and a P-type transistor DEP. The N-type transistor DEN has a first terminal, a second terminal, and a control terminal. The first terminal of the N-type transistor DEN is coupled to the input terminal of the delay element DE, the second terminal of the N-type transistor DEN is coupled to the output terminal of the delay element DE, and the control terminal of the N-type transistor DEN receives the first bias voltage, for example, the first voltage VDD. The P-type transistor DEP has a first terminal, a second terminal, and a control terminal. The first terminal of the P-type transistor DEP is coupled to the input terminal of the delay element DE, the second terminal of the P-type transistor DEP is coupled to the output terminal of the delay element DE, and the control terminal of the P-type transistor DEP receives the second bias voltage, for example the second voltage VSS.

To provide the same delay as the inverter INV, the delay element DE may be designed to have the channel width-to-length ratio of the N-type transistor DEN substantially equal to the channel width-to-length ratio of the N-type transistor INVN of the inverter INV. Also, the channel width-to-length ratio of the P-type transistor INVP of the inverter INV can be substantially equal to the channel width-to-length ratio of the P-type transistor DEP of the delay element DE.

In this case, if the P first inverters 110 and the Q second inverters 120 are implemented by the inverter INV and the R delay elements 130 are implemented by the delay element DE, then the sum of R and Q can be equal to P. Consequently, the delay caused by the P first inverters 110 would be equal to the delay caused by the Q second inverters 120 and the R delay elements 130. For example, P can be 3, Q can be 2 and R can be 1. Or, in another example, P can be 5, Q can be 2 and R can be 3. Moreover, the charge pump unit 100 may use first inverters 110 and delay elements 130 without using the second inverters 120. For example, P can be 1, Q can be 0, and R can be 1. In this case, the first capacitor C1 and the second capacitor C2 can still receive the complementary clock signals with the same delay. Therefore, the reverse current can still be prevented.

Also, in some embodiments, the delay caused by the delay element 130 can be different from the delay caused by the inverter 110 or 120, and the number of P, Q, and R can be adjusted according to the system requirement.

In FIG. 1, the charge pump unit 100 may further include a first initial pump transistor IT1 and a second initial pump transistor IT2. The first initial pump transistor IT1 has a first terminal, a second terminal, and a control terminal. The first terminal of the first initial pump transistor IT1 is coupled to the input terminal IN of the charge pump unit 100, the second terminal of the first initial pump transistor IT1 is coupled to the second terminal of the first N-type transistor N1, and the control terminal of the first initial pump transistor IT1 is coupled to the input terminal IN of the charge pump unit 100. The second initial pump transistor IT2 has a first terminal, a second terminal, and a control terminal. The first terminal of the second initial pump transistor IT2 is coupled to the input terminal IN of the charge pump unit 100, the second terminal of the second initial pump transistor IT2 is coupled to the second terminal of the second N-type transistor N2, and the control terminal of the second initial pump transistor IT2 is coupled to the input terminal IN of the charge pump unit 100.

The initial pump transistors IT1 and IT2 can be N-type transistors, and can be used to charge the second terminals of the first N-type transistor N1 and the second N-type transistor N2 to a voltage level equal to VDD-Vthn, Vthn is the threshold voltage of N-type transistors, in the beginning of the charge pump process, ensuring the charge pump unit 100 to become stable and output the pumped voltage faster.

Also, the charge pump unit 100 may further include a first pump precharge transistor TT1 and a second pump precharge transistor TT2. The first pump precharge transistor TT1 has a first terminal, a second terminal, and a control terminal. The first terminal of the first pump precharge transistor TT1 is coupled to the second terminal of the first N-type transistor N1, the second terminal of the first pump precharge transistor TT1 is coupled to the output terminal OUT of the charge pump unit 100, and the control terminal of the first pump precharge transistor TT1 is coupled to the output terminal OUT of the charge pump unit 100. The second pump precharge transistor TT2 has a first terminal, a second terminal, and a control terminal. The first terminal of the second pump precharge transistor TT2 is coupled to the second terminal of the second N-type transistor N2, the second terminal of the second pump precharge transistor TT2 is coupled to the output terminal OUT of the charge pump unit 100, and the control terminal of the second pump precharge transistor TT2 is coupled to the output terminal OUT of the charge pump unit 100.

The pump precharge transistors TT1 and TT2 can be P-type transistors, and can be used to precharge the second terminals of the first P-type transistor P1 and the second P-type transistor P2 when the charge pump unit start pumping, reducing the output setting time of the charge pump unit 100. For example, if the clock signal $SIG_{CLKA}$ changes from the second voltage VSS to the first voltage VDD, the first terminal of the first capacitor C1 is raised to a third voltage 2VDD, the first pump precharge transistor TT1 can be used to charge the second terminals of the first P-type transistor P1 to a voltage level equal to 2VDD-Vthp, Vthp is the threshold voltage of P-type transistors, ensuring the charge pump unit 100 to become stable and output the pumped voltage faster.

In addition, to reduce body effect and to avoid the junction breakdown leakage current on the first N-type transistor N1, the charge pump unit 100 may further include a first well switch WS1. The first well switch WS1 includes a third N-type transistor N3 and a fourth N-type transistor N4.

The third N-type transistor N3 has a first terminal, a second terminal, a control terminal, and a body terminal. The first terminal of the third N-type transistor N3 is coupled to the body terminal of the first N-type transistor N1, the second terminal of the third N-type transistor N3 is coupled to the second terminal of the first N-type transistor N1, the control terminal of the third N-type transistor N3 is coupled to first terminal of the first N-type transistor N1, and the body terminal of the third N-type transistor N3 is coupled to the body terminal of the first N-type transistor N1. The fourth N-type transistor N4 has a first terminal, a second terminal, a control terminal, and a body terminal. The first terminal of the fourth N-type transistor N4 is coupled to the first terminal of the first N-type transistor N1, the second terminal of the fourth N-type transistor N4 is coupled to the body terminal of the first N-type transistor N1, the control terminal of the fourth N-type transistor N4 is coupled to second terminal of the first N-type transistor N1, and the body terminal of the fourth N-type transistor N4 is coupled to the body terminal of the first N-type transistor N1.

With the well switch WS1, the voltage of the body terminal of the first N-type transistor N1 can be controlled to be no greater than the voltages of the first terminal and the second terminals of the first N-type transistor N1. Therefore, the body effect and the leakage current caused on the body terminal of the first N-type transistor N1 can be reduced.

Similarly, in FIG. 1, the charge pump unit 100 may further include a second well switch WS2, a third well switch WS3 and a fourth well switch WS4 for avoiding the leakage currents caused on the body terminals of the second N-type transistor N2, the first P-type transistor P1, and the second P-type transistor P2 respectively.

The second to fourth well switches WS2 to WS4 may have the similar structure as the well switch WS1. That is, the second well switch WS2 may include a fifth N-type transistor N5 and a sixth N-type transistor N6. The fifth N-type transistor N5 and the sixth N-type transistor N6 may be coupled to the second N-type transistor N2 in the same manner as the third N-type transistor N3 and the fourth N-type transistor N4 coupling to the first N-type transistor N1.

Also, the third well switch WS3 may include a third P-type transistor P3 and a fourth P-type transistor P4. The third P-type transistor P3 and the fourth P-type transistor P4 may be coupled to the first P-type transistor P1 in the same manner as the third N-type transistor N3 and the fourth N-type transistor N4 coupling to the first N-type transistor N1. The fourth well switch WS4 may include a fifth P-type transistor P5 and a sixth P-type transistor P6. The fifth P-type transistor P5 and the sixth P-type transistor P6 may be coupled to the second P-type transistor P2 in the same manner as the third N-type transistor N3 and the fourth N-type transistor N4 coupling to the first N-type transistor N1.

Figure 5:
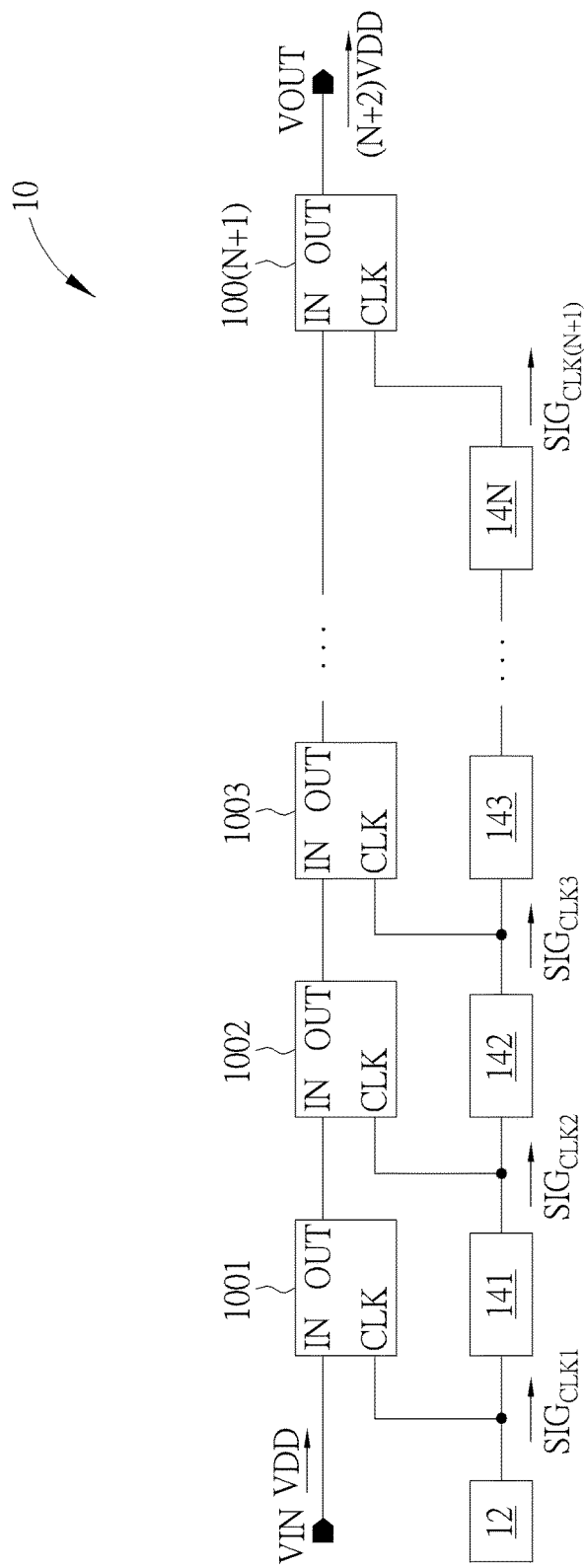
FIG. 5 shows a charge pump circuit according to one embodiment of the present disclosure.

FIG. 5 shows a charge pump circuit 10 according to one embodiment of the present disclosure. The charge pump circuit 10 includes a voltage input port VIN, a voltage output port VOUT, (N+1) charge pump units 1001 to 100(N+1), a clock signal source 12, and N clock delay elements 141 to 14N. N is a positive integer. The (N+1) charge pump units 1001 to 100(N+1) are cascaded between the voltage input port VIN and the voltage output port VOUT. That is, a first charge pump unit 1001 of the (N+1) charge pump units 1001 to 100 (N+1) is coupled to the voltage input port VIN, and a last charge pump unit 100(N+1) of the (N+1) charge pump units 1001 to 100(N+1) is coupled to the voltage output port VOUT.

In some embodiments, each of the charge pump units 1001 to 100(N+1) may have the same structure as the charge pump unit 100 as shown in FIG. 1. Therefore, with the voltage input port VIN receiving the first voltage VDD, the voltage output port VOUT can output a voltage that is (N+2) times the first voltage VDD, that is (N+2)VDD.

Also, with the structure shown in FIG. 1, the charge pump units 1001 to 100(N+1) are able to produce two synchronized complementary clock signals themselves according to the single clock signal received.

That is, when receiving the main clock signal $SIG_{CLK1}$ generated by the clock signal source 12, the charge pump units 1001 to 100(N+1) can produce the two complementary clock signals accordingly. However, if the complementary clocks generated by the charge pump units 1001 to 100(N+1) are toggling simultaneously, then the capacitors of the charge pump units 1001 to 100 (N+1) would be charged at the same time, causing high peak current each time when the two complementary clock signals toggle. Therefore, in FIG. 5, the N clock delay elements 141 to 14N are cascaded and coupled to the clock signal source 12 for generating the clock signals required by the charge pump units 1002 to 100(N+1) by delaying the main clock signal $SIG_{CLK1}$. Also, each of the clock delay elements 141 to 14N can produce a clock signal by delaying the received clock signal with a predetermined period.

For example, the output terminal of the first clock delay element 141 is coupled to the clock input terminal CLK of the second charge pump unit 1002, and the output terminal of the second clock delay element 142 is coupled to the clock input terminal CLK of the third charge pump unit 1003. Also, the clock signal $SIG_{CLK2}$ is outputted to the second clock delay element 142 for generating the clock signal $SIG_{CLK3}$. Therefore, the clock signal $SIG_{CLK3}$ would be further delayed according to the clock signal $SIG_{CLK2}$.

Figure 6:
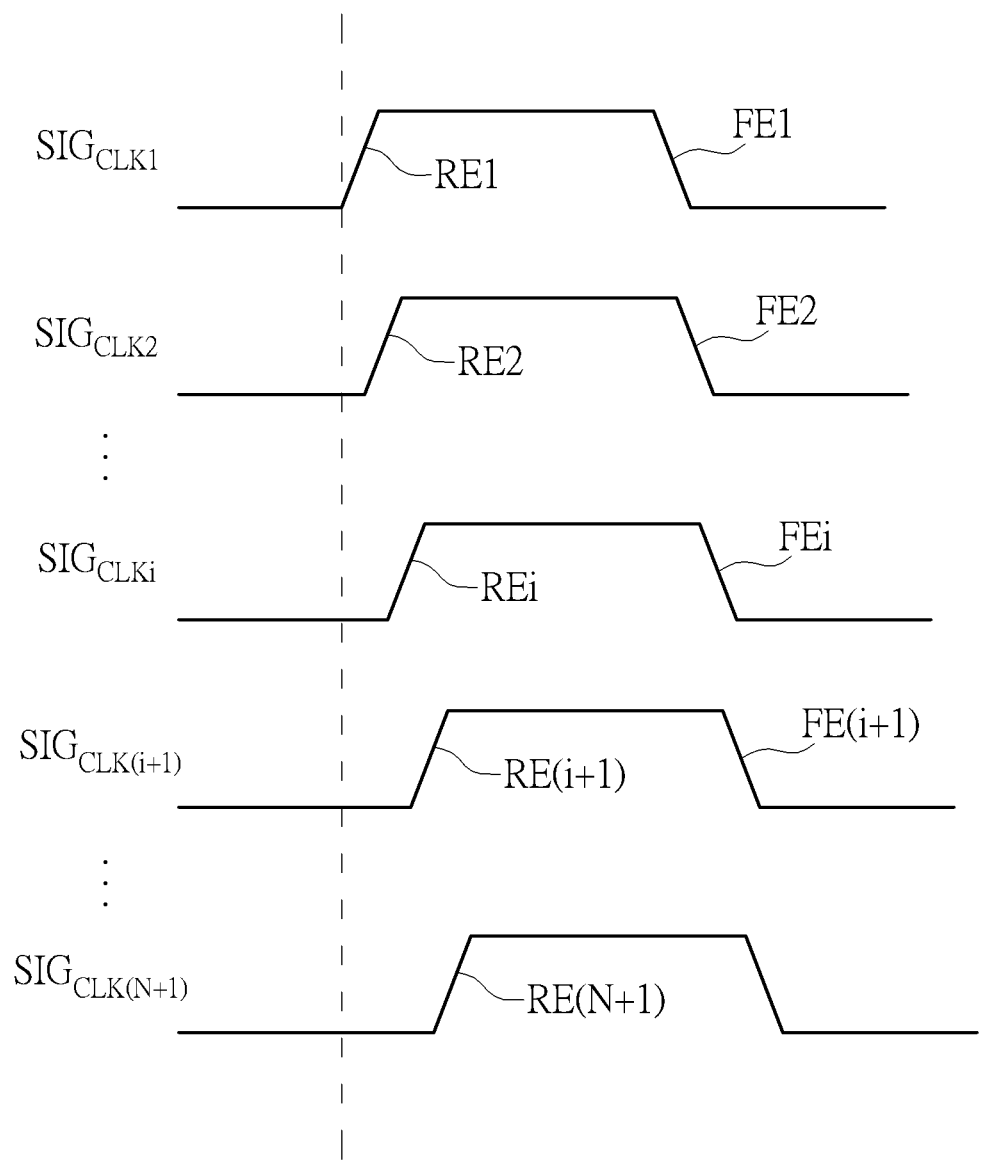
FIG. 6 shows the waveforms of the clock signals used in the charge pump circuit of FIG. 5.

FIG. 6 shows the waveforms of the main clock signal $SIG_{CLK1}$ generated by the clock signal source 12 and the clock signals $SIG_{CLK2}$ to $SIG_{CLK(N+1)}$ generated by the clock delay elements 141 to 14N. In FIG. 6, the main clock signal $SIG_{CLK1}$ and the clock signals $SIG_{CLK2}$ to $SIG_{CL(N+1)}$ are toggled sequentially. For example, the main clock signal $SIG_{CLK1}$ has a rising edge RE1 leading the rising edge RE2 of the clock signal $SIG_{CLK2}$, and the rising edge RE2 leads the rising edge RE3 of the clock signal $SIG_{CLK3}$. Also, the rising edge RE1 of the clock signal $SIG_{CLK1}$ leads the rising edge RE (i+1) of the clock signal $SIG_{CLK(i+1)}$, wherein i is an integer greater than 1 and smaller than N+1. However, the main clock signal $SIG_{CLK1}$ has a falling edge FE1 lagging the rising edge RE (N+1) of the second clock signal $SIG_{CLK(N+1)}$. Also, the falling edge FE1 leads the falling edge FE2 of the clock signal $SIG_{CLK2}$, and the falling edge FEi of the clock signal $SIG_{CLK1}$ leads the falling edge FE (i+1) of the clock signal $SIG_{CLK\ (i+1)}$. That is, the clock signals $SIG_{CLK2}$ to $SIG_{CLK(N+1)}$ can be seen as a sequential of clock signals generated by shifting the main clock signal $SIG_{CLK1}$.

In this case, the first charge pump unit 1001 receiving the main clock signal $SIG_{CLK1}$ would be charged first, the second charge pump unit 1002 receiving the clock signal $SIG_{CLK2}$ would be charged second, and so on. Consequently, the charge pump units 1001 to 100 (N+1) will not be charged at the same time, and the high peak current induced in the prior art can be avoided.

Figure 7:
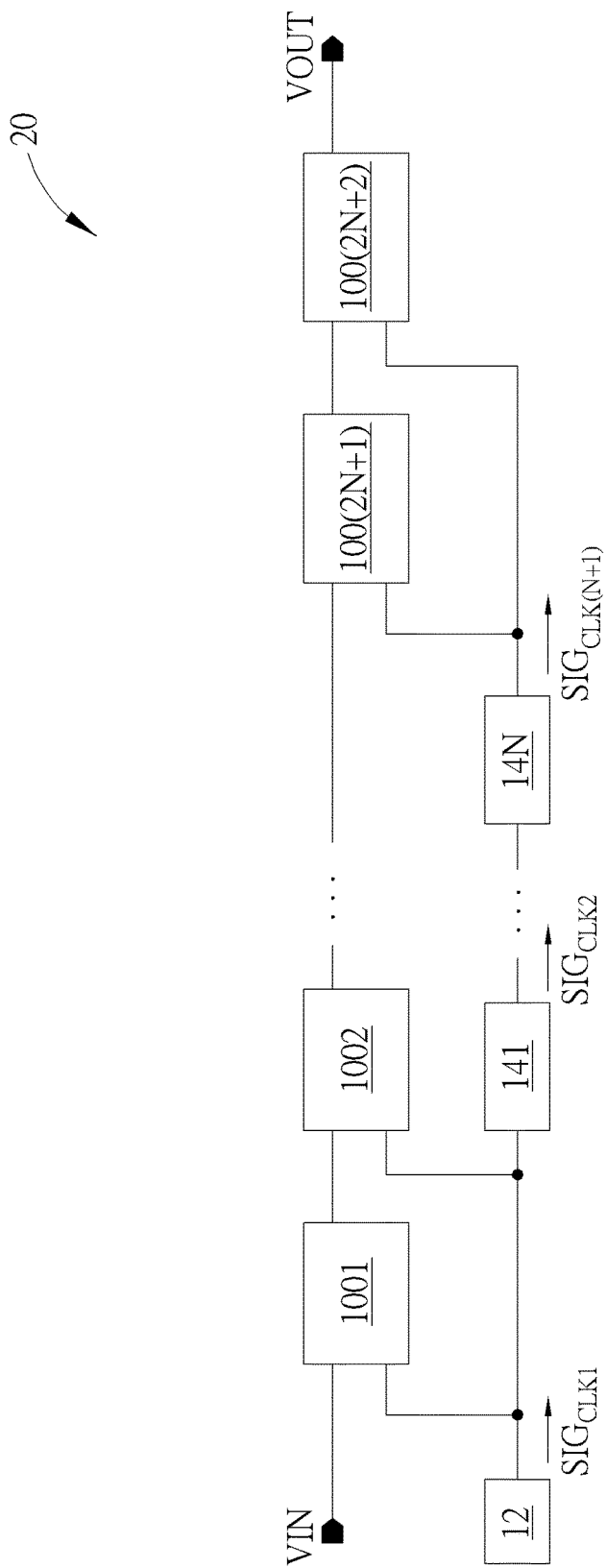
FIG. 7 shows a charge pump circuit according to another embodiment of the present disclosure.

In FIG. 5, the charge pump units 1001 to 100(N+1) receive different clock signals; however, in some embodiments, some of the charge pump units may receive the same clock signals for saving the area required by the clock delay elements. FIG. 7 shows a charge pump circuit 20 according to another embodiment of the present disclosure.

In FIG. 7, the structure of charge pump circuit 20 is similar to the structure of the charge pump circuit 10. However, the charge pump circuit 20 includes (2N+2) charge pump units 1001 to 100 (2N+2). In this case, each pair of charge pump units would receive the same clock signal. For example, the charge pump units 1001 and 1002 would receive the main clock signal $SIG_{CLK1}$, and the charge pump units 100 (2N+1) and 100 (2N+2) would receive the clock signal $SIG_{CLK(N+1)}$. Therefore, as the number of charge pump units increases, the number of the clock delay elements will increase in a slower rate, reducing the burden for meeting the area requirement of the charge pump circuit. However, the more charge pump units receive the same clock signal, the higher peak current the charge pump circuit may produce. Therefore, the charge pump circuit can be designed to have different number of charge pump units receiving the same clock signal according to the system requirement.

In summary, the charge pump units and the charge pump circuits provided by the embodiments of the present disclosure can use the delay elements and inverters to generate complementary clock signals accurately, reducing the reverse current and simplifying the clock control of the charge pump circuits. Furthermore, by delaying the clock signal of each stage of charge pump unit in the charge pump circuit, the peak current can also be reduced significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A charge pump unit comprising:
an input terminal;
an output terminal;
a first N-type transistor having a first terminal coupled to the input terminal, a second terminal, and a control terminal;
a second N-type transistor having a first terminal coupled to the input terminal, a second terminal coupled to the control terminal of the first N-type transistor, and a control terminal coupled to the second terminal of the first N-type transistor;
a first P-type transistor having a first terminal coupled to the second terminal of the first N-type transistor, a second terminal coupled to the output terminal, and a control terminal;
a second P-type transistor having a first terminal coupled to the second terminal of the second N-type transistor and the control terminal of the first P-type transistor, a second terminal coupled to the output terminal, and a control terminal coupled to the first terminal of the first P-type transistor;
a first capacitor having a first terminal coupled to the second terminal of the first N-type transistor, and a second terminal;
a second capacitor having a first terminal coupled to the second terminal of the second N-type transistor, and a second terminal;
a clock input terminal configured to receive a clock signal;
P first inverters coupled in series between the clock input terminal and the second terminal of the first capacitor, wherein P is a positive integer;
R delay elements coupled in series between the clock input terminal and the second terminal of the second capacitor, and each of the R delay elements comprising:
an input terminal;
an output terminal;
an N-type transistor having a first terminal coupled to the input terminal of the delay element, a second terminal coupled to the output terminal of the delay element, and a control terminal configured to receive a first bias voltage, and a P-type transistor having a first terminal coupled to the input terminal of the delay element, a second terminal coupled to the output terminal of the delay element, and a control terminal configured to receive a second bias voltage, wherein R is a positive integer, and the first bias voltage is greater than the second bias voltage; and
Q second inverters coupled in series with the R delay elements, wherein Q is a positive integer smaller than P and a difference between P and Q is an odd number.

2. The charge pump unit of claim 1, wherein a delay caused by the P first inverters is equal to a delay caused by the Q second inverters and the R delay elements.

3. The charge pump unit of claim 1, wherein each of the P first inverters and the Q second inverters comprises:
an input terminal;
an output terminal;
a P-type transistor having a first terminal configured to receive the first bias voltage, a second terminal coupled to the output terminal of the inverter, and a control terminal coupled to the input terminal of the inverter; and
an N-type transistor having a first terminal coupled to the output terminal of the inverter, a second terminal configured to receive the second bias voltage, and a control terminal coupled to the input terminal of the inverter;
wherein:
a channel width-to-length ratio of the N-type transistor of the inverter is substantially equal to a channel width-to-length ratio of the N-type transistor of the delay element; and
a channel width-to-length ratio of the P-type transistor of the inverter is substantially equal to a channel width-to-length ratio of the P-type transistor of the delay element.

4. The charge pump unit of claim 1, further comprising:
a first initial pump transistor having a first terminal coupled to the input terminal of the charge pump unit, a second terminal coupled to the second terminal of the first N-type transistor, and a control terminal coupled to the input terminal of the charge pump unit; and
a second initial pump transistor having a first terminal coupled to the input terminal of the charge pump unit, a second terminal coupled to the second terminal of the second N-type transistor, and a control terminal coupled to the input terminal of the charge pump unit.

5. The charge pump unit of claim 1, further comprising:
a first pump precharge transistor having a first terminal coupled to the second terminal of the first N-type transistor, a second terminal coupled to the output terminal of the charge pump unit, and a control terminal coupled to the output terminal of the charge pump unit; and
a second pump precharge transistor having a first terminal coupled to the second terminal of the second N-type transistor, a second terminal coupled to the output terminal of the charge pump unit, and a control terminal coupled to the output terminal of the charge pump unit.

6. The charge pump unit of claim 1, further comprising:
a first well switch comprising:
a third N-type transistor having a first terminal coupled to a body terminal of the first N-type transistor, a second terminal coupled to the second terminal of the first N-type transistor, a control terminal coupled to first terminal of the first N-type transistor, and a body terminal coupled to the body terminal of the first N-type transistor; and a fourth N-type transistor having a first terminal coupled to the first terminal of the first N-type transistor, a second terminal coupled to the body terminal of the first N-type transistor, a control terminal coupled to second terminal of the first N-type transistor, and a body terminal coupled to the body terminal of the first N-type transistor.

7. The charge pump unit of claim 6, further comprising:
a second well switch comprising:

a fifth N-type transistor having a first terminal coupled to a body terminal of the second N-type transistor, a second terminal coupled to the second terminal of the second N-type transistor, a control terminal coupled to first terminal of the second N-type transistor, and a body terminal coupled to the body terminal of the second N-type transistor; and a sixth N-type transistor having a first terminal coupled to the first terminal of the second N-type transistor, a second terminal coupled to the body terminal of the second N-type transistor, a control terminal coupled to second terminal of the second N-type transistor, and a body terminal coupled to the body terminal of the second N-type transistor.

8. The charge pump unit of claim 7, further comprising:
a third well switch comprising:

a third P-type transistor having a first terminal coupled to a body terminal of the first P-type transistor, a second terminal coupled to the second terminal of the first P-type transistor, a control terminal coupled to first terminal of the first P-type transistor, and a body terminal coupled to the body terminal of the first P-type transistor; and a fourth P-type transistor having a first terminal coupled to the first terminal of the first P-type transistor, a second terminal coupled to the body terminal of the first P-type transistor, a control terminal coupled to second terminal of the first P-type transistor, and a body terminal coupled to the body terminal of the first P-type transistor.

9. The charge pump unit of claim 8, further comprising:
a fourth well switch comprising:

a fifth P-type transistor having a first terminal coupled to a body terminal of the second P-type transistor, a second terminal coupled to the second terminal of the second P-type transistor, a control terminal coupled to first terminal of the second P-type transistor, and a body terminal coupled to the body terminal of the second P-type transistor; and a sixth P-type transistor having a first terminal coupled to the first terminal of the second P-type transistor, a second terminal coupled to the body terminal of the second P-type transistor, a control terminal coupled to second terminal of the second P-type transistor, and a body terminal coupled to the body terminal of the second P-type transistor.

\* \* \* \* \*